United States Patent
Mo et al.

(10) Patent No.: US 7,943,460 B2
(45) Date of Patent: May 17, 2011

(54) HIGH-K METAL GATE CMOS

(75) Inventors: Renee T. Mo, Briarcliff Manor, NY (US); Huiming Bu, Glenmont, NY (US); Michael P. Chudzik, Danbury, CT (US); William K. Henson, Beacon, NY (US); Mukesh V. Khare, Wappingers Falls, NY (US); Vijay Narayanan, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/426,457

(22) Filed: Apr. 20, 2009

(65) Prior Publication Data

US 2010/0264495 A1 Oct. 21, 2010

(51) Int. Cl.
*H01L 21/8238* (2006.01)
(52) U.S. Cl. ......... 438/216; 438/275; 438/287; 438/767
(58) Field of Classification Search .................. 438/216, 438/275, 287, 767
See application file for complete search history.

(56) References Cited

U.S. PATENT DOCUMENTS

| | | | |
|---|---|---|---|
| 5,777,364 A | 7/1998 | Crabbeet al. | |
| 6,339,232 B1 | 1/2002 | Takagi | |
| 6,784,507 B2 | 8/2004 | Wallace et al. | |
| 6,787,421 B2 | 9/2004 | Gilmer et al. | |
| 6,979,623 B2 | 12/2005 | Rotondaro et al. | |
| 7,160,771 B2 | 1/2007 | Chou et al. | |
| 7,297,587 B2 | 11/2007 | Wu et al. | |
| 7,351,632 B2 * | 4/2008 | Visokay et al. | 438/216 |
| 2005/0233533 A1 | 10/2005 | Alshareef et al. | |
| 2005/0238447 A1 | 10/2005 | Murota et al. | |
| 2005/0269634 A1 | 12/2005 | Bojarczuk, Jr. et al. | |
| 2006/0244035 A1 | 11/2006 | Bojarczuk et al. | |
| 2006/0289948 A1 | 12/2006 | Brown et al. | |
| 2007/0090416 A1 | 4/2007 | Doyle et al. | |
| 2007/0148838 A1 | 6/2007 | Doris et al. | |
| 2007/0187725 A1 | 8/2007 | Wang et al. | |
| 2008/0017936 A1 | 1/2008 | Buchanan et al. | |
| 2008/0079086 A1 * | 4/2008 | Jung et al. | 257/369 |

* cited by examiner

*Primary Examiner* — Zandra Smith
*Assistant Examiner* — Christy L Novacek
(74) *Attorney, Agent, or Firm* — Scully, Scott, Murphy & Presser, P.C.; H. Daniel Schnurmann

(57) ABSTRACT

A method of forming a semiconductor device is provided that includes forming a Ge-containing layer atop a p-type device regions of the substrate. Thereafter, a first dielectric layer is formed in a second portion of a substrate, and a second dielectric layer is formed overlying the first dielectric layer in the second portion of the substrate and overlying a first portion of the substrate. Gate structures may then formed atop the p-type device regions and n-type device regions of the substrate, in which the gate structures to the n-type device regions include a rare earth metal.

7 Claims, 4 Drawing Sheets

HIGH-K METAL GATE CMOS

FIELD OF THE INVENTION

The present disclosure relates to gate structures in metal oxide semiconductor field effect transistors.

BACKGROUND OF THE INVENTION

Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and circuitry.

Continuing trends in semiconductor device manufacturing include a reduction in electrical device feature size (scaling), as well as improvements in device performance in terms of device switching speed and power consumption. Recent MOS and CMOS transistor scaling efforts have focused on high-k dielectric materials having dielectric constants greater than that of $SiO_2$ (e.g., greater than about 3.9), which can be formed in a thicker layer than scaled $SiO_2$, and yet which produce equivalent field effect performance. Another type of CMOS device that is available is one where the gate electrode includes at least a metal layer beneath a Si-containing, e.g., polysilicon, gate electrode.

SUMMARY OF THE INVENTION

A semiconductor device is provided that includes a substrate including a first device region and a second device region; an n-type conductivity device present in the first device region including a first gate structure having at least a first high-k dielectric and at least one rare earth metal present atop the first high-k dielectric; and a p-type conductivity device present in the second device region including a second gate structure having a second high-k dielectric, the second gate structure atop a device channel including a Ge-containing layer, wherein the second high-k dielectric has a greater positive charge than the first high-k dielectric.

A semiconductor device may also be provided that includes a substrate having a first portion composed of semiconductor devices each having a gate structure including a gate dielectric of a first thickness, and a second portion composed of a semiconductor devices each having a gate structure including a gate dielectric of a second thickness, wherein the second thickness is greater than the first thickness; n-type device regions present in each of the first portion and the second portion of the substrate, the semiconductor devices present in the n-type device regions including a gate structure composed of at least one rare earth metal; and p-type device regions present in each of the first portion and the second portion of the substrate, the semiconductor devices present in the p-type device regions comprising a device channel including a Ge-containing layer.

In another aspect, a method of forming a semiconductor device is provided that includes providing a substrate having p-type device regions and n-type device regions; forming a Ge-containing layer atop the p-type device regions of the substrate, wherein the Ge-containing layer is not present in the n-type device regions; forming a first dielectric layer overlying the p-type device regions and the n-type device regions; removing the first dielectric layer from a first portion of the substrate including at least one of the p-type device regions and at least one of the n-type device regions, wherein a remaining portion of the first dielectric layer is present in a second portion of the substrate; forming a second dielectric layer having a thickness less than the first dielectric layer overlying the first dielectric layer in the first portion of the substrate and atop the second portion of the substrate; and forming gate structures atop the p-type device regions and the n-type device regions, the gate structures to the n-type device regions including a rare earth metal.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

BRIEF DESCRIPTION OF THE DRAWINGS

Figure 1:
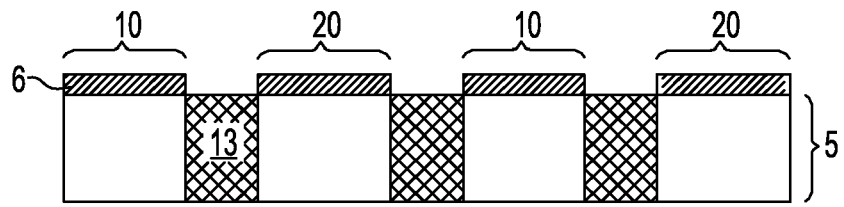
FIG. 1 depicts a side cross-sectional view of an initial structure as used in one embodiment of the present invention, in which the initial structure includes a substrate having p-type device regions and n-type device regions each having an upper surface with a hardmask dielectric layer present thereon.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods of forming complementary metal oxide semiconductor (CMOS) devices. In one embodiment, the present invention provides a low threshold voltage CMOS device, which may include features such as, but are not limited to integration of thick dielectric layers suitable for analog devices, SiGe band gap engineering to provide low threshold voltage p-type devices, and the application of rare earth metals in the gate structures of low threshold voltage n-type devices. When describing the methods, the following terms have the following meanings, unless otherwise indicated.

As used herein, "semiconductor device" refers to an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium.

An "analog device" is a device that has been designed to realize analog functions, wherein in analog functions output signal follows continuously input signal.

"Digital devices" as used herein, are devices and circuits designed to realize digital (computational) functions, wherein in digital systems output signal in response to the input signal is either "on" or "off".

As used herein, the term "conductivity type" denotes a semiconductor region being p-type or n-type.

As used herein, "p-type" refers to the addition of impurities to an intrinsic semiconductor that create deficiencies of valence electrons, such as boron, aluminum, gallium or indium to an intrinsic semiconductor substrate.

As used herein, "n-type" refers to the addition of impurities that contribute free electrons to an intrinsic semiconductor, such as antimony, arsenic or phosphorous to a semiconducting substrate.

A "gate structure" means a structure used to control output current (i.e., flow of carriers in the channel, e.g., turn "on" or "off") of a semiconductor device through electrical or magnetic fields.

As used herein, "threshold voltage" is the lowest attainable voltage that will turn on a transistor.

As used herein, the term "device channel" is the region underlying the gate structure and between the source and drain of a semiconductor device that becomes conductive when the semiconductor device is turned on.

As used herein, the term "drain" means a doped region in semiconductor device located at the end of the channel, in which carriers are flowing out of the semiconductor device through the drain.

As used herein, the term "source" is a doped region in the semiconductor device, from which the majority carriers are flowing into the channel.

As used herein, the term "dielectric" denotes a non-metallic material having a room temperature conductivity of less than about $10^{-10}(\Omega\text{-m})^{-1}$.

A "high-k" dielectric is a dielectric material having a dielectric constant of 3.9 or greater.

As used herein, "conductive" denotes a room temperature conductivity of greater than about $10^{-8}(\Omega\text{-m})^{-1}$.

"Rare earth elements", "alkaline earth metal", and "rare earth metals" as used herein include the rare earth elements that are composed of the lanthanide and actinide series of the Periodic Table of Elements.

The "Lanthanide Series" includes lanthanum, cerium, praseodymium, neodymium, promethium, samarium, europium, gadolinium, terbium, dysprosium, holmium, erbium, thulium, ytterbium, and lutetium.

The "Actinium Series" includes thorium, protactinium, uranium, neptunium, plutonium, americium, curium, berkelium, californium, einsteinium, fermium, mendelevium, nobelium, and lawrencium.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

The term "direct physical contact" or "abutting" means that a first element, such as a first structure, and a second element, such as a second structure, are connected without any intermediary conducting, insulating or semiconductor layers at the interface of the two materials.

For purposes of the description hereinafter, the terms "upper", "lower", "right", "left", "vertical", "horizontal", "top", "bottom", and derivatives thereof shall relate to the invention, as it is oriented in the drawing figures.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

FIGS. 1-14 depict one embodiment of a method of forming a semiconductor device 100 that includes providing a substrate 5 having p-type device regions 20 and n-type device regions 10 and forming a Ge-containing layer 30 atop the p-type device regions 20 of the substrate 5, wherein the Ge-containing layer 30 is not present in the n-type device regions 10. In a following process step, a first dielectric layer 40 is formed atop the p-type device regions 20 and the n-type device regions 10. Thereafter, the first dielectric layer 40 is removed from a first portion 50 of the substrate 5 including at least one of the p-type device regions 20 and at least one of the n-type device regions 10, wherein a remaining portion 40' of the first dielectric layer is present in a second portion 60 of the substrate 5. A second dielectric layer 70 having a greater dielectric constant than the first dielectric layer is then formed atop the remaining portion 40' of the first dielectric layer 40 in the second portion 60 of the substrate 5 and atop the first portion 50 of the substrate 5. Thereafter, gate structures 80a, 80b, 80c, 80d are formed atop the p-type device regions 20 and the n-type device regions 10, wherein the gate structures 80a, 80b, 80c, 80d to the n-type device regions 10 include a layer of a rare earth metal 75. The above described method, as well as structures produced by the above-described method are now described in greater detail.

FIG. 1 depicts one embodiment of a substrate 5 having p-type device regions 20 and n-type device regions 10, in which the upper surface of the substrate 5 in each of the p-type device regions 20 and the n-type device regions 10 have a hardmask dielectric layer 6 present thereon. The terms "p-type device regions" 20 and "n-type device regions" 10 mean that the source and drain regions to the subsequently formed semiconductor devices to the p-type device regions 20 are doped with p-type dopants, and the source and drain regions to the subsequently formed semiconductor devices to the n-type device regions 10 are doped with n-type dopants.

The substrate 5 may be any silicon containing substrate including, but not limited to Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures. In one embodiment, when the substrate 5 is a silicon-on-insulator (SOI) or SiGe-on-insulator (SGOI) substrate, the thickness of the semiconducting Si-containing layer atop the buried insulating layer (not shown) may be 10 nm or greater. In one embodiment, the SOI or SGOI substrate may be fabricated using a thermal bonding process, or alternatively be fabricated by an ion implantation process, such as separation by ion implantation of oxygen (SIMOX).

The substrate 5 may also include an isolation region 13 separating the semiconductor portion of the n-type device regions 10 from the p-type device regions 20. In one embodiment, the isolation regions 13 may also separate, i.e., electrically isolate, other devices that are present on the substrate. In one embodiment, the isolation region 13 is formed by etching a trench in the substrate 5 utilizing a dry etching process, such as reactive-ion etching (RIE) or plasma etching, and then filling the trench with an insulating material, such as an oxide. In one embodiment, the trench may be filled using a deposition method, such as chemical vapor deposition (CVD).

The hardmask dielectric layer 6 may be a nitride, an oxide, and/or oxynitride material. Some examples of materials for the hardmask dielectric layer 6 include, but are not limited to $SiO_2$, $Si_3N_4$, SiON, boron phosphate silicate glass, $Al_2O_3$, $HfO_2$, $ZrO_2$, HfSiO, or any combination thereof. Typically, the hardmask dielectric layer 6 may have a thickness ranging from 1 nm to 500 nm. In another embodiment, the hardmask dielectric layer 6 has a thickness ranging from 50 nm to 450 nm. The hardmask dielectric layer 6 may be deposited by chemical vapor deposition (CVD). Variations of CVD processes include, but not limited to Atmospheric Pressure CVD (APCVD), Low Pressure CVD (LPCVD) and Plasma Enhanced CVD (PECVD), Metal-Organic CVD (MOCVD) and combinations thereof.

Figure 2:
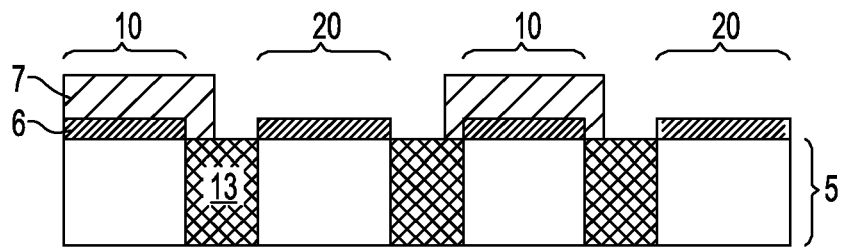
FIG. 2 depicts a side cross-sectional view of forming a first etch mask overlaying the n-type device regions.
Figure 3:
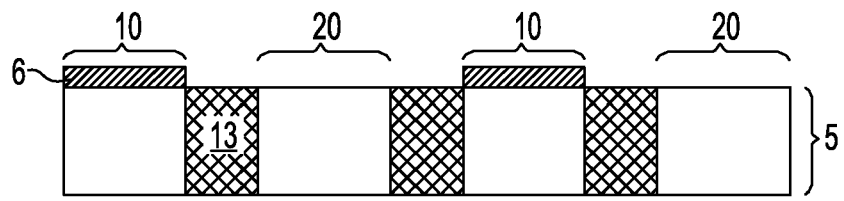
FIG. 3 depicts a side cross-sectional view of removing the hardmask dielectric layer from the p-type device regions, in accordance with one embodiment of the present invention.

FIGS. 2 and 3 depict one embodiment of removing the hardmask dielectric layer 6 from the p-type device regions 20. Referring to FIG. 2, the hardmask dielectric layer 6 may be removed from the p-type device regions 20 utilizing lithography and etching. For example, the lithographic step may include applying a photoresist to the hardmask dielectric layer 6, exposing the photoresist to a pattern of radiation and developing the pattern into the exposed photoresist utilizing a resist developer to provide a first etch mask 7. The first etch mask 7 may be a patterned photoresist present overlying the portion of the hardmask dielectric layer 6 that is atop at least the n-type device regions 10, wherein the portion of the hardmask dielectric layer 6 atop the p-type device regions 20 is exposed, as depicted in FIG. 2. It is noted that although the above-described embodiment utilizes a patterned photoresist for the first etch mask 7 to remove the hardmask dielectric layer 6 from the p-type device regions 20, in other embodiments of the present invention, a hardmask material, such as a dielectric, may be substituted for the photoresist used to provide the first etch mask 7.

Referring to FIG. 3, the exposed portion of the hardmask dielectric layer 6, i.e., the portion of the hardmask dielectric layer 6 overlying the p-type device regions 20, may then be removed using an etching process, such as a selective etching process. As used herein, the term "selective" in reference to a material removal process denotes that the rate of material removal for a first material is greater than the rate of removal for at least another material of the structure to which the material removal process is being applied. In one embodiment, the etching process includes, but is not limited to: wet etching, such as dilute HF or buffered HF, chemical reactive ion etching (RIE), plasma etching, ion beam etching or laser ablation. Following etching, the first etch mask 7 is typically removed from the structure utilizing a resist stripping process, such as oxygen ashing, or a wet resist strip using a mixture of sulfuric acid and peroxide.

Figure 4:
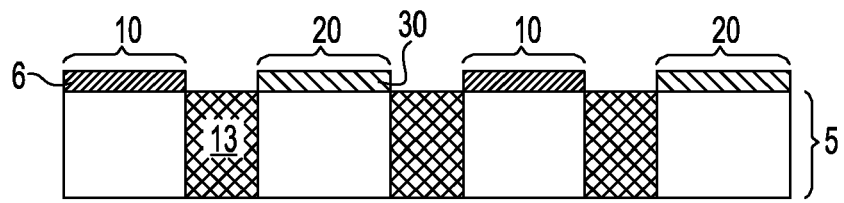
FIG. 4 depicts a side cross-sectional view of one embodiment of forming a Ge-containing layer atop the p-type device regions of the substrate, wherein the Ge-containing layer is not present in the n-type device regions, in accordance with the present invention.

FIG. 4 depicts one embodiment of forming a Ge-containing layer 30 atop the p-type device regions 20 of the substrate 5, wherein the Ge-containing layer 30 is not formed in the n-type device regions 10. In one embodiment, the Ge-containing layer 30 provides the device channel of the subsequently semiconductor devices to the p-type device regions 20. The Ge-containing layer 30 is typically composed of silicon germanium (SiGe). Typically, the Ge-containing layer 30 has a thickness ranging from 1 nm to 100 nm. In another embodiment, the Ge-containing layer 30 has a thickness ranging from 20 nm to 80 nm. Suitable growth methods for providing the Ge-containing layer 30 may include, but are not limited to: selective epitaxial growth, molecular beam epitaxy (MBE), chemical beam epitaxy (CBE), chemical vapor deposition (CVD), plasma-enhanced chemical vapor deposition (PECVD) and ion-assisted deposition.

In one embodiment, the Ge-containing layer 30 is formed using a selective deposition process, in which a semiconductor material nucleates and deposits on a semiconductor surface, i.e., on the exposed surface of the p-type device regions 20, e.g., a silicon containing surface of the substrate 5 in the p-type device regions 20, while not depositing on insulator surfaces. In one embodiment, the Ge-containing layer 30 is not formed on the surface of the remaining portion of the hardmask dielectric layer 6 that is present in the n-type device regions 10 of the substrate 5 and the surface of the isolation regions 13. In one embodiment, selectivity of the deposition process may be provided by an etchant such as dichlorosilane, hydrogen chloride (HCl) in the reactant stream or by a germanium source, such as germane ($GeH_4$) or di-germane ($Ge_2H_6$).

The Ge-containing layer 30 that is formed over the Si-containing surface of the substrate 5 in the p-type device regions 20 may be epitaxial or polycrystalline depending on deposition conditions and surface preparation. In one embodiment, the deposition temperature is typically in the range from 450° C. to 1,000° C. In another embodiment, the deposition temperature ranges from 600° C. to 900° C. Typical process pressure for Ge-containing layer 30 formation can range from 1 Torr to 200 Torr.

Figure 5:
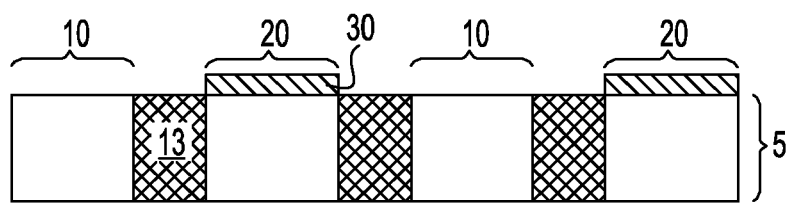
FIG. 5 depicts a side cross-sectional view of one embodiment of removing a remaining portion of the hardmask dielectric layer from the n-type device regions, in accordance with the present invention.

FIG. 5 depicts one embodiment of removing the remaining portion of the hardmask dielectric layer 6 from the n-type device regions 10. The Ge containing layer 30 is present in the p-type device regions 20 to provide a work function adjustment that optimizes the subsequently formed pFETs. The remaining portion of the hardmask dielectric layer may be removed by a selective etch process, in which the etch chemistry removes the hardmask dielectric layer 6 selective to the underlying surface of the substrate 5 in the n-type device regions 10, the isolation regions 13, and the Ge-containing layer 30. In one example, in which the hardmask dielectric is composed of silicon oxide ($SiO_2$), the Ge-containing layer 30 is composed of SiGe, and the isolation regions 13 are composed of silicon oxide ($SiO_2$), the etch chemistry may include dilute HF or buffered HF.

Figure 6:
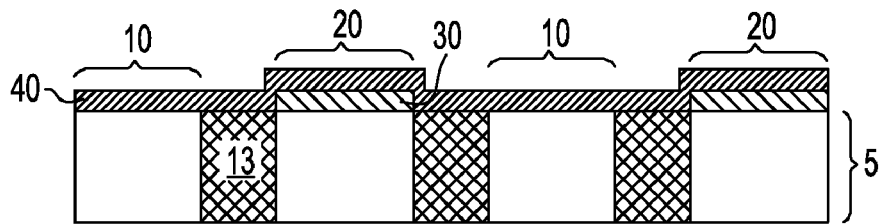
FIG. 6 depicts a side cross-sectional view of one embodiment of forming a first dielectric layer overlying the p-type device regions and the n-type device regions, in accordance with the present invention.

FIG. 6 depicts one embodiment of forming a first dielectric layer 40 overlying the p-type device regions 20 and the n-type device regions 10. The first dielectric layer 40 may be composed of an oxide, a nitride and/or an oxynitride. The first dielectric layer 40 may be formed using chemical vapor deposition, such as plasma enhanced chemical vapor deposition, or thermal growth. Typically, the first dielectric layer 40 has a thickness from 1 nm to 10 nm. More typically, the first dielectric layer 40 has a thickness from 1 nm to 4 nm.

Figure 7:
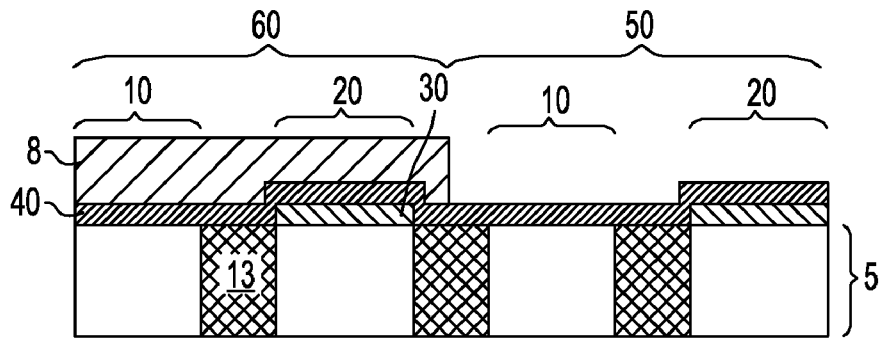
FIG. 7 depicts a side cross-sectional view of forming a second etch mask over a second portion of the substrate.
Figure 8:
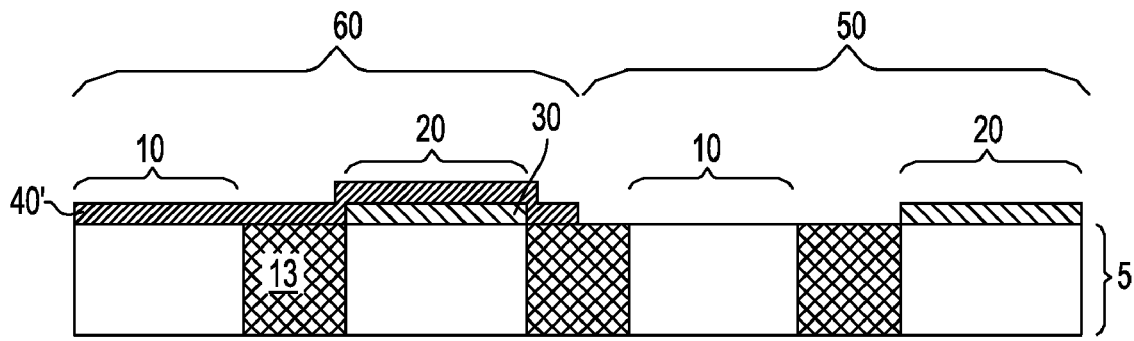
FIG. 8 depicts a side cross-sectional view of removing the first dielectric layer from a first portion of the substrate including at least one of the p-type device regions and at least one of the n-type device regions, wherein a remaining portion of the first dielectric layer is present in a second portion of the substrate, in accordance with the present invention.

FIGS. 7 and 8 depict removing the first dielectric layer 40 from a first portion 50 of the substrate 5 including at least one of the p-type device regions 20 and at least one of the n-type device regions 10, wherein a remaining portion 40' of the first dielectric layer is present in a second portion 60 of the substrate 5. In one embodiment, the remaining portion 40' of the first dielectric layer contributes to the gate dielectric thickness of subsequently formed analog devices. The first dielectric layer 40 is removed from a first portion 50 of the substrate 5 using photolithography and etch processes. More specifically, a pattern is produced by applying a photoresist layer to the surface to be etched, exposing the photoresist layer to a pattern of radiation, and then developing the pattern into the photoresist layer utilizing a resist developer to provide a second etch mask 8. Once the second etch mask 8 is completed, the sections of the first dielectric layer 40 covered by the second etch mask 8 are protected, while the exposed regions are removed using a selective etching process that removes the unprotected portion. In one embodiment, the etching process includes, but is not limited to chemical reactive ion etching (RIE), plasma etching, ion beam etching or laser ablation. In one embodiment, in which the first dielectric layer 40 is composed of silicon oxide ($SiO_2$), the substrate 5 is composed of silicon (Si) and the Ge-containing layer 30 is composed of silicon germanium (SiGe), the exposed portion of the first dielectric layer 40 is removed using a selective etch process having an etch chemistry composed of dilute Hf or buffered HF.

Following etching, the second etch mask 8 may be removed from the structure utilizing a resist stripping process, such as oxygen ashing, or a wet resist strip using sulfuric acid and peroxide. It is noted that although the above-described embodiment utilizes a patterned photoresist for the second etch mask 8 to remove the first dielectric layer 40 from the first portion 50 of the substrate 5, in other embodiments of the present invention, a hardmask material, such as a dielectric, may be substituted for the photoresist used to provide the second etch mask 8.

Figure 9:
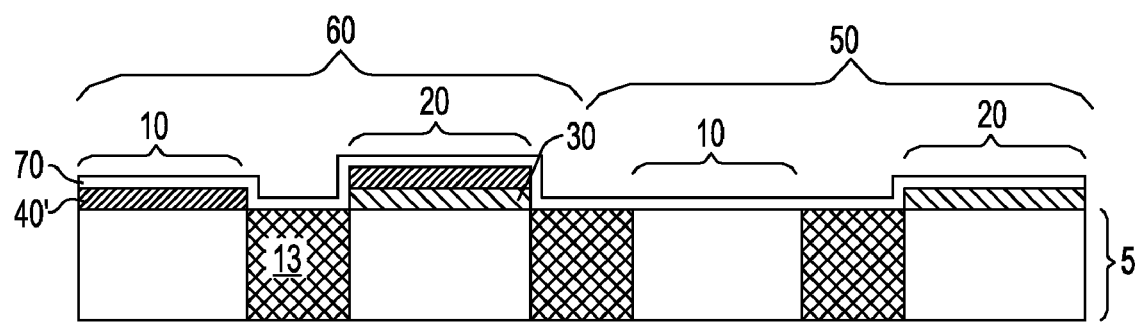
FIG. 9 depicts a side cross-sectional view of one embodiment of forming a second dielectric layer overlying the first dielectric layer in the first portion of the substrate and overlying the second portion of the substrate, in accordance with the present invention.

FIG. 9 depicts one embodiment of forming a second dielectric layer 70 overlying the first dielectric layer 40' in the second portion 60 of the substrate 5, and atop the upper surface of the first portion 50 of the substrate 5. In one embodiment, the second dielectric layer 70 provides the gate dielectric thickness of subsequently formed digital devices in the first portion 50 of the substrate 5.

In one embodiment, the second dielectric layer 70 is composed of a high-k dielectric material. The high-k dielectric material may be composed of an insulating material having a dielectric constant of greater 4.0. In another embodiment, the high-k dielectric material has a dielectric constant greater than 7.0. The high-k dielectric material may include an oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of materials for the high-k dielectric material include hafnium silicate, hafnium silicon oxynitride or combinations thereof.

The high-k dielectric material may be deposited by chemical vapor deposition (CVD). Chemical vapor deposition (CVD) is a deposition process in which a deposited species is formed as a result of a chemical reaction between gaseous reactants at greater than room temperature, wherein solid product of the reaction is deposited on the surface on which a film, coating, or layer of the solid product is to be formed. Variations of CVD processes include, but are not limited to: Atomic layer deposition, Atmospheric Pressure CVD (APCVD), Low Pressure CVD (LPCVD), Plasma Enhanced CVD (EPCVD), Metal-Organic CVD (MOCVD) and combinations thereof. The high-k dielectric material may be deposited using a conformal deposition method. The term "conformal" denotes a layer having a thickness that does not deviate from greater than or less than 20% of an average value for the thickness of the layer.

The second dielectric layer 70 typically has a thickness that is less than the first dielectric layer 40'. In one embodiment, in which the second dielectric layer 70 is composed of a high-k dielectric material, the second dielectric layer may have a thickness of less than 10 nm and greater than 0.8 nm. More typically, the second dielectric layer 70 is composed of a high-k dielectric material has a thickness ranging from 1.0 nm to 6.0 nm.

FIGS. 10-14 depict forming gate structures 80a, 80b, 80c, 80d atop the p-type device regions 20 and the n-type device regions 10, in which the gate structures 80a, 80b, 80c, 80d to the n-type device regions 10 include an alkaline earth metal-containing material or a rare earth metal (or a rare earth-like).

Figure 10:
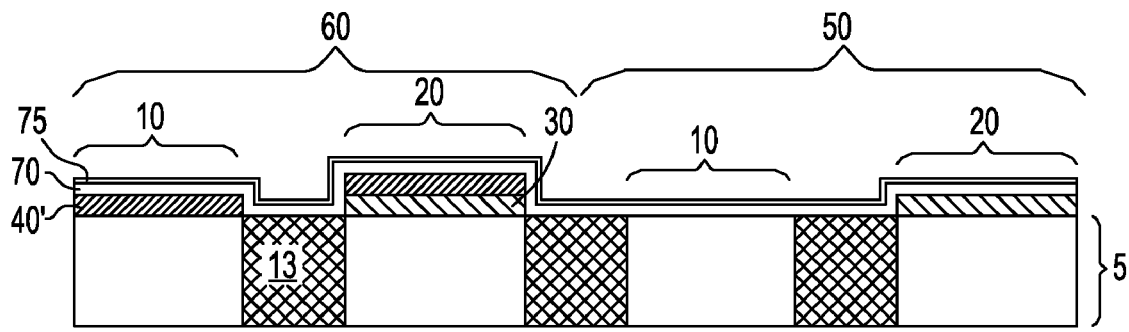
FIG. 10 depicts a side cross-sectional view of forming a rare earth metal layer on the substrate.

Referring to FIG. 10, a layer of an alkaline earth metal-containing material or a rare earth metal (or a rare earth-like) containing material 75, hereafter collectively referred to as a rare earth metal layer 75, is formed atop at least the second dielectric layer 70 and overlying the first dielectric layer 40' that is present in the second portion 60 of the substrate 5, and the second dielectric layer 70 that is present in the first portion 50 of the substrate 5. The rare earth metal layer 75 may be blanket deposited atop the upper surface of the structure depicted in FIG. 9 including the upper surface of the isolation region 13. In one embodiment, the rare earth metal layer 75 is composed of a compound having the formula $M_xA_y$, wherein M is an alkaline earth metal (Be, Mg, Ca, Sr, and/or Ba), A is one of O, S or a halide, x is 1 or 2, and y is 1, 2 or 3. In one embodiment, the present invention contemplates a rare earth metal layer composed of rare earth metal compounds that include a mixture of alkaline earth metals and/or a mixture of anions, such as —$OCl_2$. Examples of rare earth metal compounds that may be used in some embodiments of the present invention include, but are not limited to: MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, SrF$_2$, SrCl$_2$, SrBr$_2$, SrI$_2$, BaO, BaS, BaF$_2$, BaCl$_2$, BaBr$_2$, and BaI$_2$. In one embodiment of the present invention, the rare earth metal layer 75 includes Mg. MgO is another alkaline earth metal-containing material that may be employed in the rare earth metal layer 75. In another example, the rare earth metal layer 75 comprises an oxide or nitride of at least one element from Group IIIB of the Periodic Table of Elements including, e.g., La, Ce, Pr, Nd, Pm, Sm, Eu, Ga, Tb, Dy, Ho, Er, Tm, Yb, Lu or mixtures thereof. The rare earth metal layer 75 may also comprise an oxide of La, Ce, Y, Sm, Er, and/or Th. In one example, the rare earth metal layer 75 is composed of La$_2$O$_3$ or LaN.

The rare earth metal layer 75 may be formed utilizing a deposition process including, for example, sputtering from a target, reactive sputtering of an alkaline earth metal under oxygen plasma conditions, electroplating, evaporation, molecular beam deposition, MOCVD, ALD, PVD and other like deposition processes. The rare earth metal layer 75 typically has a deposited thickness ranging from 0.1 nm to 3.0 nm. In another example, the rare earth metal layer 75 has a thickness from 0.3 nm to 1.6 nm.

The presence of the rare earth metal layer 75 in the n-type device regions 10 provides a second dielectric layer 70 having a greater positive charge, i.e., the second dielectric is electropositive, than the first dielectric layer 40. The presence of the rare earth metal 75 in the n-type device regions provides a work function shift that optimizes the nFETs. The electropositive element is utilized in the nFET, whereas the Ge-containing layer, i.e., SiGe layer, is present in the pFET to provide independent work function adjustments to optimize both the pFET and the nFET.

Figure 11:
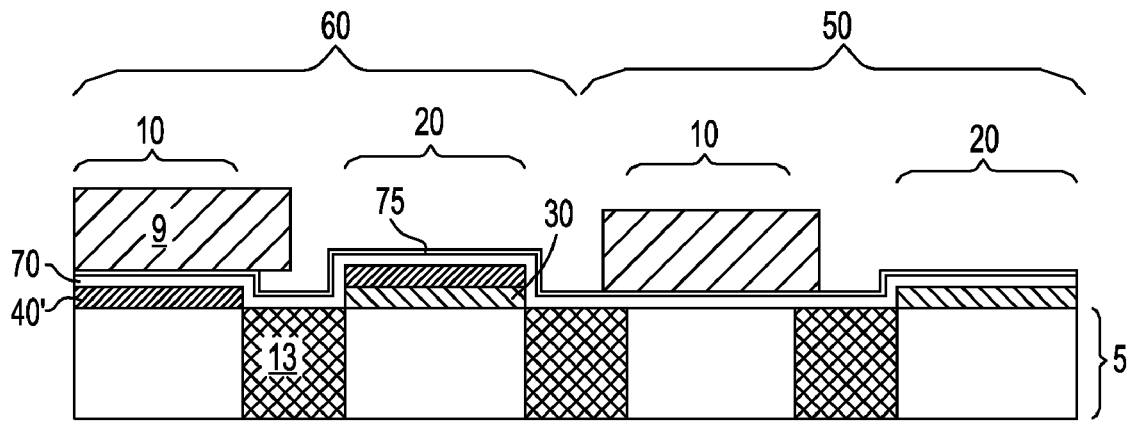
FIG. 11 depicts a side cross-sectional view of forming a third etch mask that protects the portion of the rare earth metal that is overlying the n-type device regions.

Next, and as shown in FIG. 11, a third etch mask 9 is formed that protects the portion of the rare earth metal layer 75 that is overlying the n-type device regions 10 of the substrate 5, wherein the third etch mask 9 exposes the portion of the rare earth metal layer 75 that is overlying the p-type device regions 20. The third etch mask 9 is formed using similar materials and techniques as discussed above to provide the first etch mask 7 and the second etch mask 8, but may also include other processes known to those skilled in the art. Following the formation of the third etch mask 9, etch process may be utilized to remove the exposed portion of the rare earth metal layer 75, i.e., the portion of the rare earth metal layer 75 that is overlying the p-type device regions 20 of the substrate 5, wherein the rare earth metal layer 75 remains in the n-type device regions 10 of the substrate. Following etch, the third etch mask 9 may be removed utilizing a stripping process.

Figure 12:
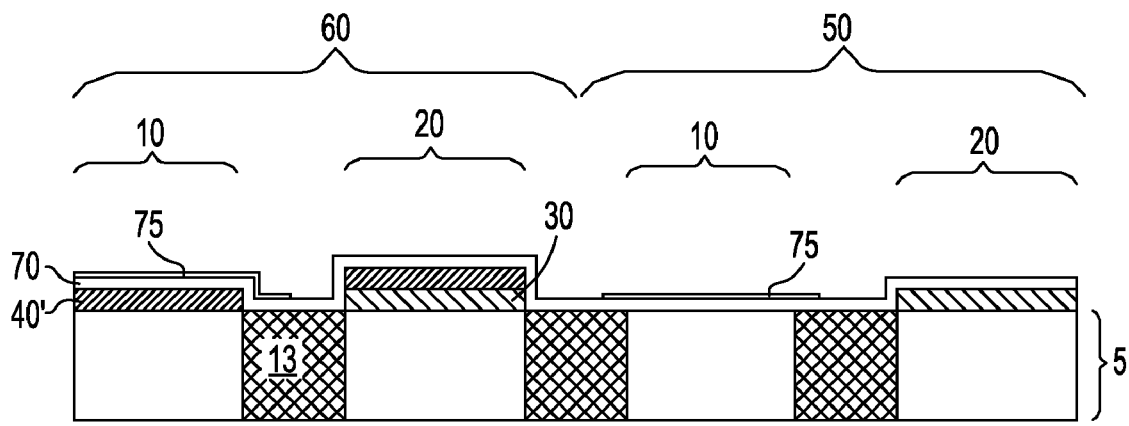
FIG. 12 depicts a side cross-sectional view of removing the rare earth metal layer from the p-type device regions.

FIG. 12 shows the structure that is formed after removing rare earth metal layer 75 from within the pFET device regions 20.

Figure 13:
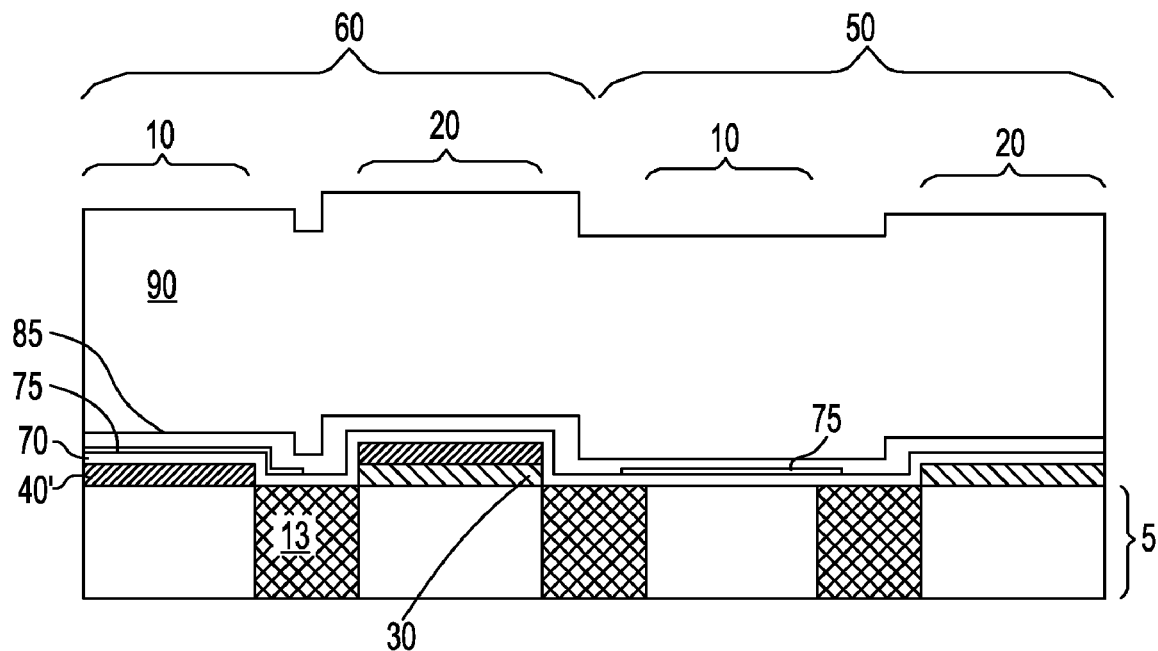
FIG. 13 depicts a side cross-sectional view of blanket depositing a gate metal layer over the structure depicted in FIG. 12.

Referring to FIG. 13, in a following process step, a gate metal layer 85 is blanket deposited on the upper surface of the structure shown in FIG. 12 utilizing a deposition process. Examples of deposition processes that can be used in forming the gate metal layer 85 include, but are not limited to CVD, PVD, ALD, sputtering or evaporation. The gate metal layer 85 includes a metallic material that is capable of conducting electrons. For example, the gate metal layer 85 may include a metal nitride or a metal silicon nitride. In one embodiment, the gate metal layer 85 is composed of a metal from Group IVB or VB of the Periodic Table of Elements. Hence, the gate metal layer 85 may include, but is not limited to: Ti, Zr, Hf, V, Nb, Ta or alloys thereof. In one example, the gate metal layer 85 comprises TiN or TaN. The physical thickness of the gate metal layer 85 may vary, but typically, the gate metal layer 85 has a thickness ranging from 0.5 nm to 200 nm, with a thickness ranging from 5 nm to 80 nm being more typical.

In one embodiment of the present invention, the gate metal layer 85 is TiN that is deposited by evaporating Ti from an effusion cell held in the range of 1550° C. to 1900° C., and using an atomic/excited beam of nitrogen that is passed through a remote radio frequency source. The TiN may be deposited, in other ways, as well, such as chemical vapor deposition or sputtering.

Still referring to FIG. 13, following the formation of the gate metal layer 85, a gate electrode 90 is formed atop the gate metal layer 85. Specifically, a blanket layer of a conductive material is formed on the gate metal layer 85 utilizing a deposition process, such as, for example, physical vapor deposition, CVD or evaporation. The conductive material used as the gate electrode 90 includes, but is not limited to Si-containing materials such as Si or a SiGe alloy layer in either single crystal, polycrystalline or amorphous form. The gate electrode 90 may also be a conductive metal or a conductive metal alloy. Combinations of the aforementioned conductive materials are also contemplated herein. Si-containing materials are suitable as the gate electrode (or conductor) 90, with polySi being most typical. In addition to aforementioned conductive materials, the present invention also contemplates instances wherein the conductor is fully silicided or a stack including a combination of a silicide and Si or SiGe. In one embodiment, fully silicided gates can be formed. The blanket layer of gate electrode material may be doped or undoped. If doped, an in-situ doping deposition process may be employed in forming the same. Alternatively, a doped gate electrode 90 can be formed by deposition, ion implantation and annealing. The ion implantation and annealing can occur prior to or after a subsequent etching step that patterns the material stack. The thickness, i.e., height, of the gate electrode 90 may vary depending on the deposition process employed. Typically, the gate electrode 90 has a vertical thickness ranging from 20 nm to 180 nm, with a thickness ranging from 40 nm to 150 nm being more typical.

In a following process step, the gate stacks, i.e., gate structures 80a, 80b, 80c, 80d are formed by lithography and etching of the material layers described above. The resultant structure that is formed after gate stack formation is shown, for example, in FIG. 14. Following patterning of the material stack, at least one spacer (not shown) is typically, but not always, formed on exposed sidewalls of each patterned gas structure 80a, 80b, 80c, 80d. The at least one spacer is comprised of an insulator, such as an oxide, nitride, oxynitride and/or any combination thereof. The at least one spacer is formed by deposition and etching. The width of the at least one spacer may be selected such that the source and drain silicide contacts (to be subsequently formed) do not encroach underneath the edges of the gate structures 80a, 80b, 80c, 80d.

Source and drain dopant regions (not shown) are then formed into the substrate 5. The source and drain dopant regions are formed utilizing ion implantation and an annealing step. The annealing step serves to activate the dopants that were implanted by the previous implant step. The conditions for the ion implantation and annealing are well known to those skilled in the art. The source/drain diffusion regions may also include extension implant regions, which are formed closer to the gate than the source/drain implantation using a conventional extension implant. The extension implant may be followed by an activation anneal, or alternatively the dopants implanted during the extension implant and the source/drain implant can be activated using the same activation anneal cycle. Halo implants are also contemplated herein. Further, CMOS processing such as formation of silicided contacts (source/drain and gate) as well as formation of BEOL (back-end-of-the-line) interconnect levels with metal interconnects can be formed utilizing processing steps that are well known to those skilled in the art.

Figure 14:
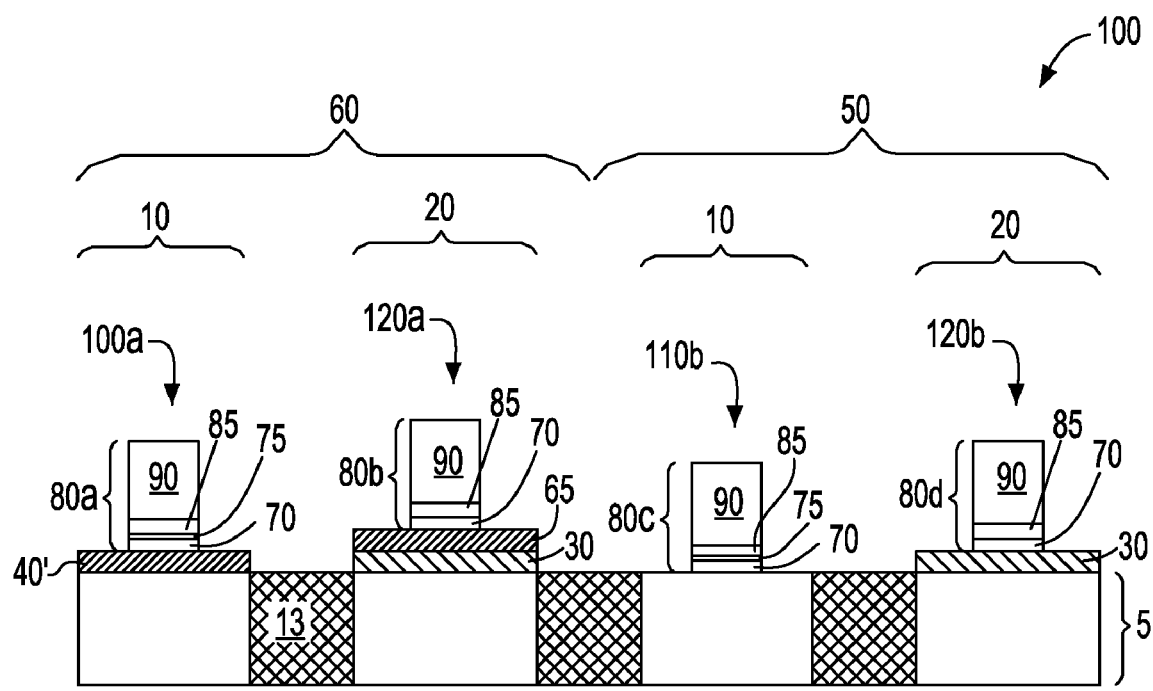
FIG. 14 depicts a side cross-sectional view of forming gate structures atop the p-type device regions and the n-type device regions, in which the gate structures to the n-type device regions include a rare earth metal, in accordance with one embodiment of the present invention.

Still referring to FIG. 14, in one embodiment, the above-described method produces a semiconductor device 100 including a substrate 5 having a first device region 10 (interchangeably referred to as an n-type device region 10) and a second device region (interchangeably referred to as a p-type device region 20). In one embodiment, an n-type conductivity device 110a, 110b is present in the first device region 10 that includes a first gate structure 80a having at least a first high-k dielectric (provided by the second dielectric layer 70) and at least one rare earth metal (provided by the rare earth metal layer 75) present atop the first high-k dielectric, and a p-type conductivity device 120a, 120b is present in the second device region 20 including a second gate structure 80b composed of a second high-k dielectric (provided by the second dielectric layer 70) that is present atop a device channel composed of SiGe (provided by the Ge-containing layer 30). In one example, the n-type conductivity device 110a, 110b is an nFET having a work function ranging from 4.0 eV to 4.3 eV, and the p-type conductivity device 120a, 120b is a pFET having a 4.9 eV to 5.2 eV.

At least one of the first high-k dielectric and the second high-k dielectric may be composed of $HfO_2$ or $HfSiO_xN_y$, wherein the first high-k dielectric and the second high-k dielectric may be composed of the same material. In another embodiment, the first high-k dielectric and the second high-k dielectric may be composed of a nitride-containing layer.

In one embodiment, the first gate structure 80a and the second gate structure 80b may include a metal gate conductor (also referred to a gate metal layer 85), wherein the metal gate conductor of the first gate structure 80a is of a substantially same composition of the metal gate conductor of the second gate structure 80b. For example, the metal gate conductor may be composed of TiN. The p-type conductivity device 120 may further comprise a Si cap (not shown) overlying the device channel composed of SiGe. The rare earth metal may be composed of La, Ce, Pr, Nd, Pm, Sm, En, Ga, Tb, Dy, Ho, Er, Tm, Yb, Lu or alloys thereof.

In another embodiment, a semiconductor device 100 is provided that includes a first portion 50 of a substrate 5 composed of semiconductor devices each having a gate structure 80c, 80d including a gate dielectric of a first thickness and a second portion 60 of the substrate 5 composed of semiconductor devices each having a gate structure 80a, 80b including a gate dielectric of a second thickness, in which the second thickness is greater than the first thickness. The gate dielectric of the second thickness is typically provided by the combination of the remaining portion of the first dielectric layer 40' and the second dielectric layer 70 that is present in the second portion 60 of the substrate 5. The gate dielectric of the first thickness is typically provided by the second dielectric layer 70 that is present in the first portion 50 of the substrate 5.

The semiconductor device 100 may further include n-type device regions 10 that are present in each of the first portion 50 and the second portion 60 of the substrate 5. The n-type device regions 10 may include semiconductor devices having gate structures 80a with gate dielectrics of the second thickness, and semiconductor devices having gate structures 80c with gate dielectrics of the first thickness, wherein each of the semiconductor devices in the n-type device regions 10 include at least one rare earth metal.

The semiconductor device 100 may further include p-type device regions 20 that are present in each of the first portion 50 and the second portion 60 of the substrate 5. The p-type device regions 20 may include semiconductor devices having gate structures 80b with gate dielectrics of the first thickness, and semiconductor devices having gate structures 80d with gate dielectrics of the second thickness, wherein each of the semiconductor devices in the p-type device regions 20 include a device channel composed of SiGe. In one embodiment, analog devices are present having the gate dielectric of the first thickness, wherein digital devices are present having the gate dielectric of the second thickness. The analog devices may be present in the first portion 50 of the substrate 5, and the digital devices may be present in the second portion 60 of the substrate 5.

In one embodiment, the gate dielectric of the first thickness ranges from 1 nm to 10 nm, typically ranging from 1 nm to 4 nm, and the gate dielectric to the second thickness ranges from about 1 nm to about 3 nm. The gate dielectric of the first thickness and the gate dielectric of the second thickness may be composed of an oxide.

In one embodiment, the above-described methods and structures provide a high performance, low threshold voltage CMOS device. In one example, the CMOS device may feature integration of devices incorporating thick dielectric structures that are suitable for analog applications in combination with the application of SiGe band engineering for low threshold voltage pMOS devices and the utilization of gate structures composed of rare earth metals for providing low threshold voltage nMOS devices. The present integration scheme may also be applied to high performance SRAM devices.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed as new is:

1. A method of forming a semiconductor device comprising:
    forming a Ge-containing layer atop p-type device regions of a substrate, wherein the Ge-containing layer is not present in the n-type device regions of the substrate;
    forming a first dielectric layer atop the p-type device regions and the n-type device regions;
    removing the first dielectric layer from a second portion of the substrate including at least one of the p-type device regions and at least one of the n-type device regions, wherein a remaining portion of the first dielectric layer is present in a first portion of the substrate;
    forming a second dielectric layer overlying the first dielectric layer in the first portion of the substrate and overlying the second portion of the substrate;
    forming gate structures atop the p-type device regions and the n-type device regions, the gate structures to the n-type device regions including a rare earth metal; and
    forming analog devices in the first portion of the substrate and digital devices in the second portion of the substrate.

2. The method of claim 1, wherein the providing of the substrate having p-type device regions and n-type device regions further comprises forming a hardmask dielectric layer at an upper surface of each of the p-type device regions and the n-type device regions.

3. The method of claim 1, wherein prior to the forming of the Ge-containing layer atop the p-type device regions of the substrate, the method further comprises forming an etch mask atop the n-type device regions that exposes the p-type device regions, etching a hardmask dielectric layer in the n-type device regions to expose an upper surface of the substrate in the p-type device regions, and removing the etch mask.

4. The method of claim 1, wherein the Ge-containing layer is composed of SiGe.

5. The method of claim 4, wherein the forming of the first dielectric layer overlying the p-type device regions and the n-type device regions comprises removing a remaining portion of a hardmask dielectric layer from the n-type device regions and depositing the dielectric layer having a thickness ranging from about 1 nm to about 10 nm.

6. The method of claim 5, wherein the forming of the second dielectric layer overlying the first dielectric layer in the first portion of the substrate and overlying the second portion of the substrate comprises depositing a high-k dielectric material having a thickness ranging from about 1 nm to about 3 nm.

7. A method of forming a semiconductor device comprising:
   forming a Ge-containing layer atop p-type device regions of a substrate, wherein the Ge-containing layer is not present in the n-type device regions of the substrate;
   forming a first dielectric layer atop the p-type device regions and the n-type device regions;
   removing the first dielectric layer from a second portion of the substrate including at least one of the p-type device regions and at least one of the n-type device regions, wherein a remaining portion of the first dielectric layer is present in a first portion of the substrate;
   forming a high-k dielectric layer overlying the first dielectric layer in the first portion of the substrate and overlying the second portion of the substrate;
   depositing a rare earth metal atop the high-k dielectric material;
   removing the rare earth metal from the p-type device regions;
   forming a metal nitride layer overlying the rare earth metal in the n-type device regions and atop the high-k dielectric material in the p-type device regions;
   forming a Si-containing layer atop the metal nitride layer; and
   patterning the rare earth metal, the high-k dielectric material, the metal nitride layer and the Si-containing layer to provide gate structures atop the p-type device regions and the n-type device regions.

* * * * *